US006507205B1

(12) United States Patent
Dibish et al.

(10) Patent No.: US 6,507,205 B1
(45) Date of Patent: Jan. 14, 2003

(54) LOAD BOARD WITH MATRIX CARD FOR INTERFACING TO TEST DEVICE

(75) Inventors: Michael J. Dibish, Fremont, CA (US); Sunae Kang, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 106 days.

(21) Appl. No.: 09/713,650

(22) Filed: Nov. 14, 2000

(51) Int. Cl.[7] ............................................. G01R 31/02
(52) U.S. Cl. ...................................... 324/755; 439/70
(58) Field of Search ................................ 324/755, 765; 439/66, 70, 71, 72

(56) References Cited

U.S. PATENT DOCUMENTS

| | | | | |
|---|---|---|---|---|
| 4,724,379 A | * | 2/1988 | Hoffman | 123/406.39 |
| 5,460,531 A | * | 10/1995 | Vivio | 439/70 |
| 5,705,932 A | * | 1/1998 | Frederickson | 324/754 |
| 6,005,403 A | * | 12/1999 | Webster et al. | 324/755 |
| 6,094,056 A | * | 7/2000 | Bardsley et al. | 324/754 |
| 6,118,286 A | * | 9/2000 | Frederickson | 324/754 |
| 6,156,188 A | * | 12/2000 | Yang et al. | 205/662 |

* cited by examiner

Primary Examiner—Christine K. Oda
Assistant Examiner—Vincent Q. Nguyen
(74) Attorney, Agent, or Firm—Scott R. Brown; Hovey Williams; Lois D. Cartier

(57) ABSTRACT

A tester to device-under-test interface is disclosed in which a PCB has a socket for a device under test (DUT), one or more cable connectors for cables from an IC tester, an interface matrix card slot having a plurality of contacts electrically connected to the DUT socket and the cable connector pins, and an interface matrix card having a plurality of horizontal and vertical conductors capable of being electrically connected to each other for mapping the proper connection of signals between the DUT socket and the tester cables.

4 Claims, 2 Drawing Sheets

LOAD BOARD WITH MATRIX CARD FOR INTERFACING TO TEST DEVICE

FIELD OF THE INVENTION

The present invention relates to integrated circuit semiconductor device test apparatus, more particularly to a load board and interface card that allows different device designs using the same package type to be tested on a single board.

BACKGROUND

After an integrated circuit semiconductor device (IC) has been manufactured and packaged, it is necessary to test the completed article to determine whether it is functional. The packaging for an IC can take different standard forms, including dual in-line pins, ball grid arrays, thin quad flat packages, and many others. Each of these packages has a different external form factor and a different pin placement. (Pins are contacts used to interface between the semiconductor device inside the package and the external circuitry with which the device will operate.) Each package type requires its own specific socket design for receiving the pins of the IC package that interface with the device inside the package. Many different IC designs can be assembled into, for instance, a standard ball grid array package.

In order to test ICs after they have been assembled into their final package, the IC is supplied with power and ground, and a specialized test computer (a tester) sends signals to the input pins of the device under test (DUT). The output pins of the DUT are monitored by the tester and signals presented on those pins by the IC in response to the tester signals are recorded while the device is exercised. The tester compares the monitored output signals to expected results for a fully functioning device of the design being tested. ICs that do not respond correctly to the tester signals are identified as non-functioning.

The same IC design can be ultimately packaged into different package types, such as ball grid array or thin quad flat pack. The IC is the same whether it is packaged in a thin quad flat pack or a ball grid array, but the external pins from the different packages are physically located in different positions. Although the tester has one set of tests unique to each IC design, there must be a way to map the tester pins to the correct pinout of the different package types into which the IC is assembled.

The prior art approach to creating an interface between the tester and the DUT is to custom design a printed circuit board (PCB) that interfaces the pins of the DUT to the pins of one or more cables connected to the tester. Each signal sent from the tester must be routed to a particular pin on the DUT. Likewise, the signal on each tested output pin of the DUT must be routed to the correct cable pin from the tester. Each IC design has a variety of pins for interfacing to other circuits. These pins include power, ground, input/output, and perhaps function control pins for putting the IC into different functional modes or other types of pins.

Thus, using the prior art approach, a unique design is necessary to interface the tester to each IC design and each package type into which that design is assembled. In the prior art approach, for each integrated circuit design a number of custom designed test PCBs (load boards) must be created, one for each package type into which the given IC design is assembled. With a custom test PCB for each package type used for each IC design, the number of test boards required to test a manufacturer's product line adds up quickly. The number of custom test boards required can also increase depending upon the volume of products being manufactured, because more than one test board can be required to meet throughput requirements of the manufacturer. Added to the overhead in creating multiple test boards, there is a cost in engineering design time and in time to manufacture the test boards.

Therefore, it is desirable to reduce the overhead associated with design time and materials for testing packaged integrated circuit devices by employing a new method that utilizes a standard load board for each IC package type that is customizable to the DUT, and thereby reduces the number of load boards required to test a manufacturer's devices and reduces the time required to develop load boards.

SUMMARY OF THE INVENTION

In accordance with the present invention, a tester to device-under-test interface is provided in which a PCB has a socket for the device under test, one or more cable connectors for cables from an IC tester, an interface matrix card slot having a plurality of contacts electrically connected to the DUT socket and the cable connector pins, and an interface matrix card having a plurality of horizontal and vertical conductors capable of being electrically connected to each other for mapping the proper connection of signals between the DUT socket and the tester cables.

DETAILED DESCRIPTION

Figure 1:
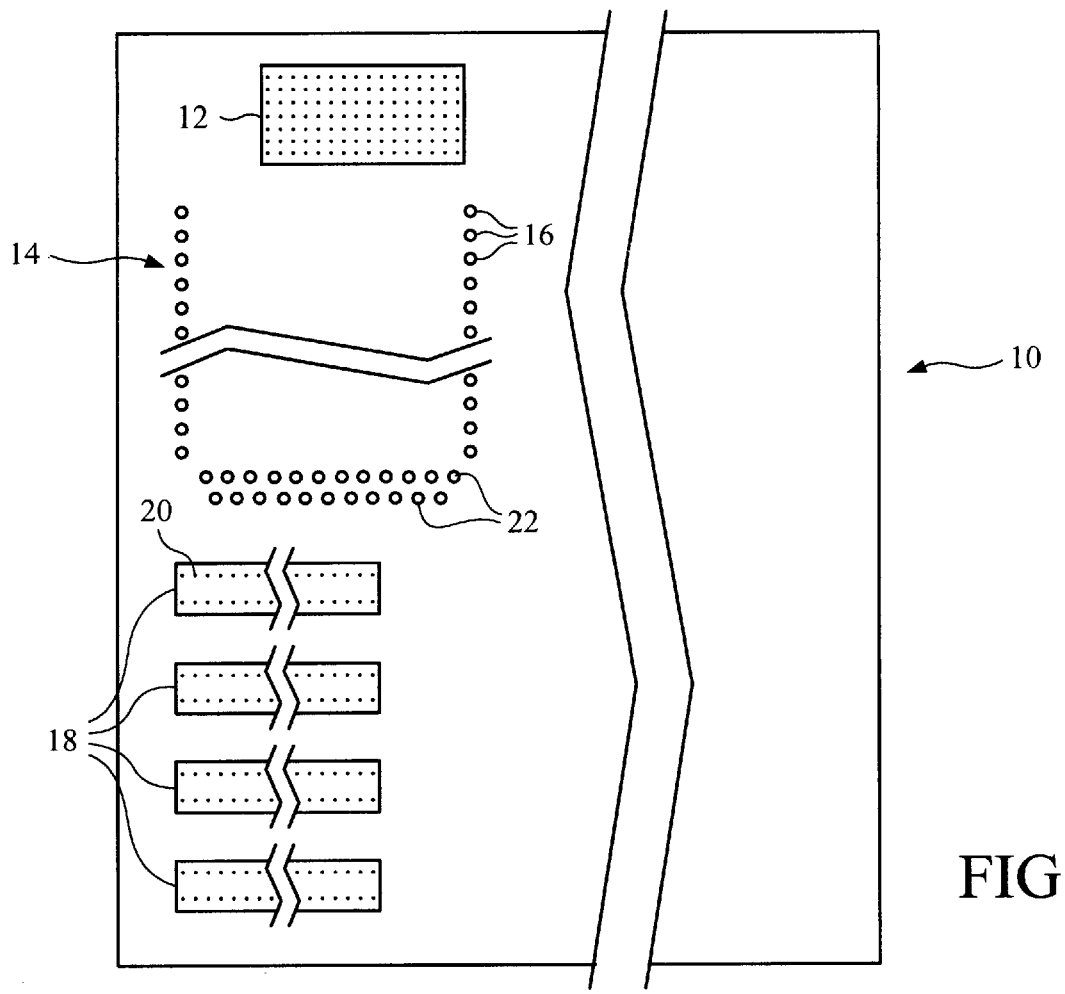
FIG. 1 is a top schematic view of a test board of the invention.

FIG. 1 illustrates one embodiment of the interface test board 10 of the invention. The test board 10 is a printed circuit board (PCB) having multiple electrically isolated layers on which electrical traces can route signals. The test board 10 of FIG. 1 includes a number of sockets 12 each for receiving a device under test (DUT). Although only one socket 12 is shown in FIG. 1, up to N such DUT sites can be provided. In one embodiment, N is equal to 3. Each of the test chip sockets 12 is connected by electrical traces on a different layer of the PCB to the interface card matrix slot 14. In the preferred embodiment, the traces from the test device socket terminate in contact points 16 along either side of the interface card slot.

At the bottom of FIG. 1 are shown four cable connector sockets 18 for receiving connector cables (not shown) from the IC tester. The cables comprise test leads that carry signals to and from the tester. The cables connect to pins 20 located in the cable connector sockets. The pins 20 of the cable connector sockets are connected by electrical traces on a lower layer of the PCB to the interface card slot 14. The cable connector electrical traces terminate in electrical contacts 22 in the interface card slot 14 along the bottom of the slot. Any appropriate method can be used to connect the interface card to the interface card slot. In one embodiment, pogo pins are located at each contact point 16 and 22. It is also possible to use a slot for receiving an edge connector, if the interface matrix card is designed having an edge connector for all necessary contacts.

Figure 2:
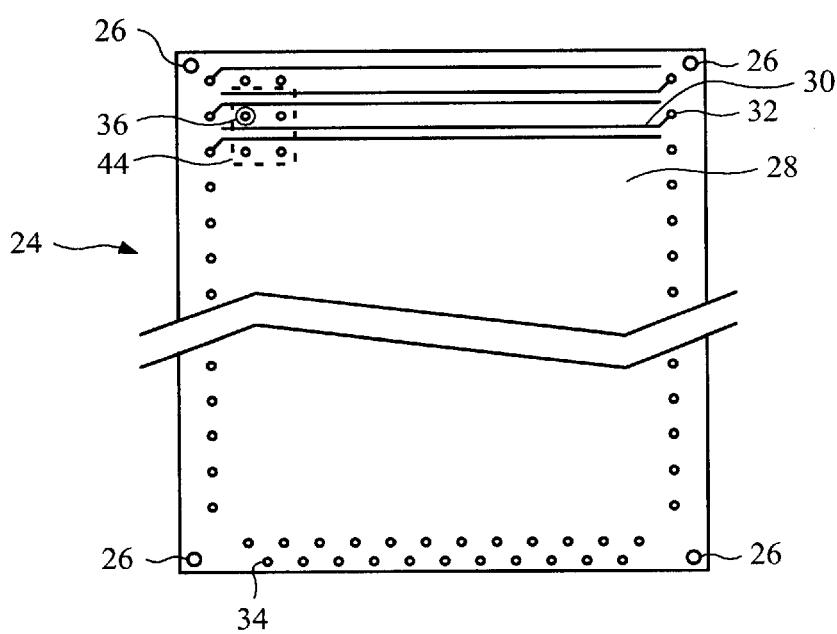
FIG. 2 is a top schematic view of an interface matrix card of the invention.

FIG. 2 shows an interface matrix card 24 of the invention. This card is a PCB having multiple layers and carrying electrical conductors on the different layers so that they are electrically isolated from each other. The interface matrix card 24 has a top surface 28 and a bottom surface. Only the top surface 28 is shown in FIG. 2, but the bottom surface is similar in nature. The interface matrix card has a plurality of screws 26 that are used to tighten the card in position over the pogo pins. When the card is completely tightened, full electrical contact is assured between the interface card and the pogo pins located at the contact points 16 and 22 of the interface card slot 14.

The top surface 28 of the interface matrix card 24 has a plurality of horizontal conductors 30. (The term "horizontal" as used in this context means horizontal with respect to the top surface of the interface matrix card as shown in FIG. 2.) Each of these conductors terminates on one side or the other side of the card at a contact point 32. The contact point 32 electrically contacts a pogo pin that connects the contact point to a corresponding contact point 16 of the slot 14 when the interface matrix card 24 is properly attached to the interface matrix card slot 14.

Figure 3:
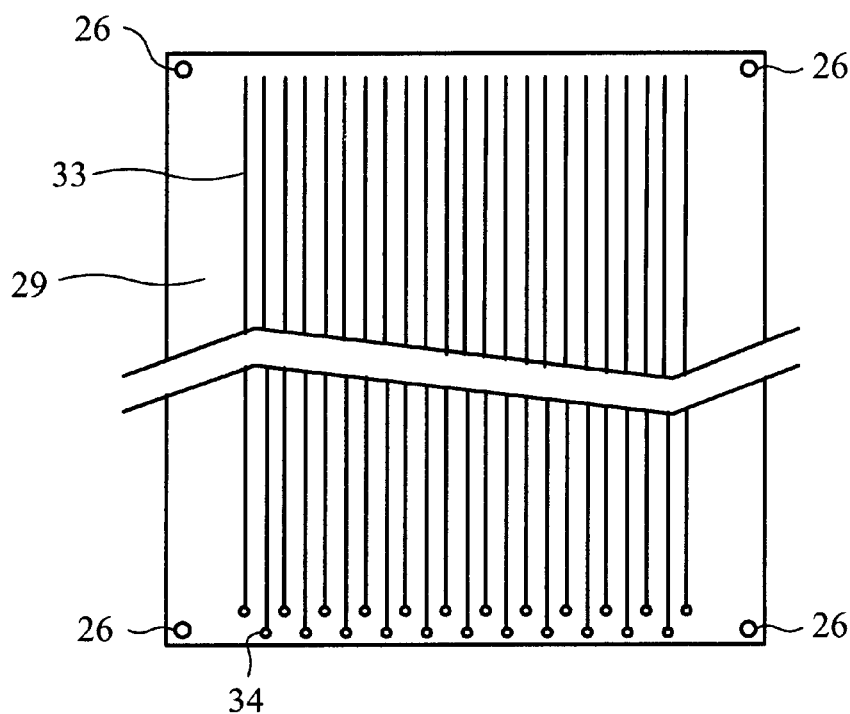
FIG. 3 is a schematic view of an interior layer of an interface matrix card of the invention.

FIG. 3 depicts an interior layer 29 of the interface matrix card. This layer is electrically isolated from the top layer and has vertical conductors 33 that extend for substantially the "height" of the region covered by the horizontal conductors 30 of the surface 28. (The term "vertical" as used in this context means vertical with respect to the interior layer of the interface matrix card as shown in FIG. 3, or essentially orthogonal to the horizontal conductors shown in FIG. 2.) Each vertical conductor 33 terminates at a contact point 34 along one edge of the interface matrix card. Each contact 34 electrically contacts with a pogo pin that connects the contact 34 to a corresponding contact 22 of the interface matrix card slot 14 when the interface matrix card 24 is properly attached to the slot 14. As described above, the slot contacts 22 are electrically connected to the traces in the tester board that originate at the connector cable sockets and that conduct signals between the interface card matrix slot and the tester leads of the connector cables.

Figure 4:
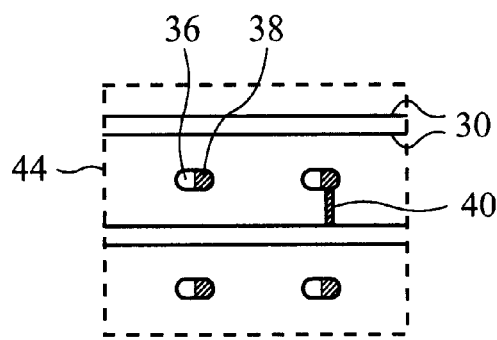
FIG. 4 is a schematic view of a region of the interface matrix card of FIG. 2.

FIG. 4 depicts a close up view of the dashed region 44 of card 24 shown in FIG. 2. Interspersed between each two horizontal conductors 30 is a via 36 that connects a contact point 38 on the surface layer 28 of the interface matrix card 24 to a vertical conductor 33 in the interior layer 29 of the card 24. The contact points 38 can be electrically connected to a horizontal conductor 30 at the surface using a micro weld 40 by depositing a small amount of conductive metal, through soldering or any other convenient means, that makes an electrical connection between the via and the horizontal conductor. It has been found that micro welding is a quick, efficient, and relatively inexpensive way of customizing the interface matrix card. Thus, every vertical conductor can be electrically connected to each of the horizontal conductors. In this way, the pins from the IC tester can be mapped to the required pins of the device under test. A unique mapping exists for each combination of IC design and package type.

By providing an interface matrix card slot and an interface matrix card, it is possible to substantially reduce the overhead involved in creating test boards. Rather than designing a custom test board for each IC design and each package type utilized by that IC design, a mapping of tester pins to DUT pins can be created by micro welding the correct pattern onto an interface matrix card. To change the design being tested on a given test PCB, the corresponding interface matrix card is inserted into the test PCB and the board is thereby customized to test the new design. Generally, the correct mapping on an interface matrix card between test pins and a DUT can be created in less than twenty-four hours. All that is required is the pinout listing for the DUT and the matching pinout listing from the IC tester that will test the DUT. The interface matrix card can be quickly and efficiently inserted into the interface matrix card slot, and the use of pogo pins ensures complete connections between all contacts.

This unique customization method reduces design time for creating test boards, reduces materials used to create test boards, and allows for great flexibility in testing ICs at the manufacturing facility. The use of the interface matrix card also reduces the number of test boards required to be on hand at any given time. For each IC package type in production, the manufacturer need have only enough boards to meet the volume requirements of the manufacturing process. It is not necessary to have a different test board for each package type multiplied by the number of IC designs being manufactured. The interface matrix card makes the tester board independent of the particular IC design.

The above description of the invention is intended to be illustrative and not limiting. Other embodiments of this invention will be obvious to those skilled in the art in view of the above disclosure.

What is claimed is:

1. An integrated circuit test board assembly, comprising:

a test socket for connecting to pins of an integrated circuit;

an interface slot;

a connector slot for connecting to test leads from an integrated circuit tester;

a first plurality of conductive traces connecting the test socket to the interface slot;

a second plurality of conductive traces connecting the connector slot to the interface slot; and a customizable interface matrix card connected to the interface slot, the customizable interface matrix card comprising:

an array of horizontal and vertical conductors, wherein one or more of the horizontal conductors is connected to the first plurality of conductive traces, and wherein one or more of the vertical conductors is connected to the second plurality of conductive traces, and a plurality of connection points selectively electrically connecting the horizontal conductors to the vertical conductors.

2. The test board assembly of claim 1, wherein the vertical and horizontal conductors are connected to the interface slot through pogo pins.

3. The test board assembly of claim 1, wherein the connection points are selectively connected to the horizontal conductors by micro welding.

4. The test board assembly of claim 1, wherein there is a corresponding connection point to selectively connect each vertical conductor to each horizontal conductor.

* * * * *